United States Patent [19]

Suzki et al.

[11] 4,262,208
[45] Apr. 14, 1981

[54] PHOTO-ELECTRICAL DETECTING APPARATUS

[75] Inventors: Akiyoshi Suzki, Tokyo; Ichiro Kano; Hideki Yoshinari, both of Yokohama; Masao Tozuka, Ohmiya; Ryozo Hiraga, Yokohama; Yuzo Kato, Yokohama; Yasuo Ogino, Yokohama, all of Japan

[73] Assignee: Canon Kabushiki Kaisha, Tokyo, Japan

[21] Appl. No.: 49,980

[22] Filed: Jun. 19, 1979

Related U.S. Application Data

[63] Continuation of Ser. No. 900,857, Apr. 28, 1978, abandoned.

[30] Foreign Application Priority Data

May 1, 1977 [JP] Japan ................................ 52/50605

[51] Int. Cl.³ ............................................. G02B 21/06
[52] U.S. Cl. ................................... 250/548; 356/446
[58] Field of Search ............... 250/216, 571, 572, 548, 250/557; 356/446, 399, 400, 401; 350/91

[56] References Cited

U.S. PATENT DOCUMENTS

4,062,623  12/1977  Suzuki et al. ........................ 350/91

Primary Examiner—David Nelms
Assistant Examiner—Darwin R. Hostetter
Attorney, Agent, or Firm—Fitzpatrick, Cella, Harper & Scinto

[57] ABSTRACT

This invention relates to a photo-electrical detecting apparatus for forming a dark-field image of an object on a one-dimensional image sensor and reading said image photo-electrically. The apparatus includes a telecentric objective lens, and a light source image is formed on the clear aperture plane of said lens, said image being in focus in a direction on said plane and out of focus in a perpendicular direction. A line- or band-shaped area of the object is illuminated by the light from said light source image. Thus a dark-field image of the object is formed on said one-dimensional image sensor by providing, on a plane equivalent to said aperture plane, a filter which intercepts the normal reflected light from said object and transmits the scattered light therefrom.

8 Claims, 13 Drawing Figures

PHOTO-ELECTRICAL DETECTING APPARATUS

This is a continuation of application Ser. No. 900,857 filed Apr. 28, 1978 now abandoned.

BACKGROUND OF THE INVENTION

1. Field of the Invention

The present invention relates to a photo-electrical detecting apparatus for forming a dark-field image of an object on a one-dimensional image sensor and photo-electrically reading said image.

2. Description of the Prior Art

A photo-electrical detecting apparatus for photoelectrically reading a dark-field image of an object is already disclosed in the U.S. Pat. Nos. 3,796,497 and 5,062,623. Particularly the latter discloses an apparatus for reading a dark-field image of an object by means of a one-dimensional image sensor such as a one-dimensional image pick-up tube, a chargecoupled device or a photo-detector array.

The present invention relates to an improvement on the apparatus disclosed in said U.S. Pat. No. 4,062,623, said improvement being featured in that the object is illuminated with a line- or band-shaped light beam. In case of reading an object by means of a one-dimensional image sensor, an illumination of the entire surface of the object is quite useless, and it is desirable to illuminate only a line- or band-shaped area which is to be read by said image sensor. In such case, however, the illuminating system is required to satisfy the condition of forming a dark-field image on a one-dimensional image sensor, i.e. conditions of employing a telecentric arrangement for the objective lens and forming an image of illuminating light source on the plane of aperture of said objective lens. A telecentric objective lens is a lens the front focal point of which coincides with the position of the entrance aperture thereof. However, in case of the apparatus disclosed in the aforementioned U.S. Pat. No. 4,062,623 wherein the image of illuminating light source formed on the plane of aperture is in focus in two perpendicular directions, the illuminated area on the object becomes two-dimensionally spread.

SUMMARY OF THE INVENTION

The object of the present invention, therefore, is to provide a photo-electrical detecting apparatus capable of illuminating a line- or band-shaped area of an object, forming a dark-field image of said area on a one-dimensional image sensor and photo-electrically reading said image.

The above-mentioned object can be achieved by forming a line image of the light source in the position of the clear aperture of the telecentric objective lens, said image being in focus in one direction and out of focus in a direction perpendicular thereto.

DESCRIPTION OF THE PREFERRED EMBODIMENT

Prior to the description of the present invention, there will be given a brief explanation on the photo-electrical detecting apparatus disclosed in the aforementioned U.S. Pat. No. 4,062,623, while making reference to FIGS. 1 to 3.

Figure 1:
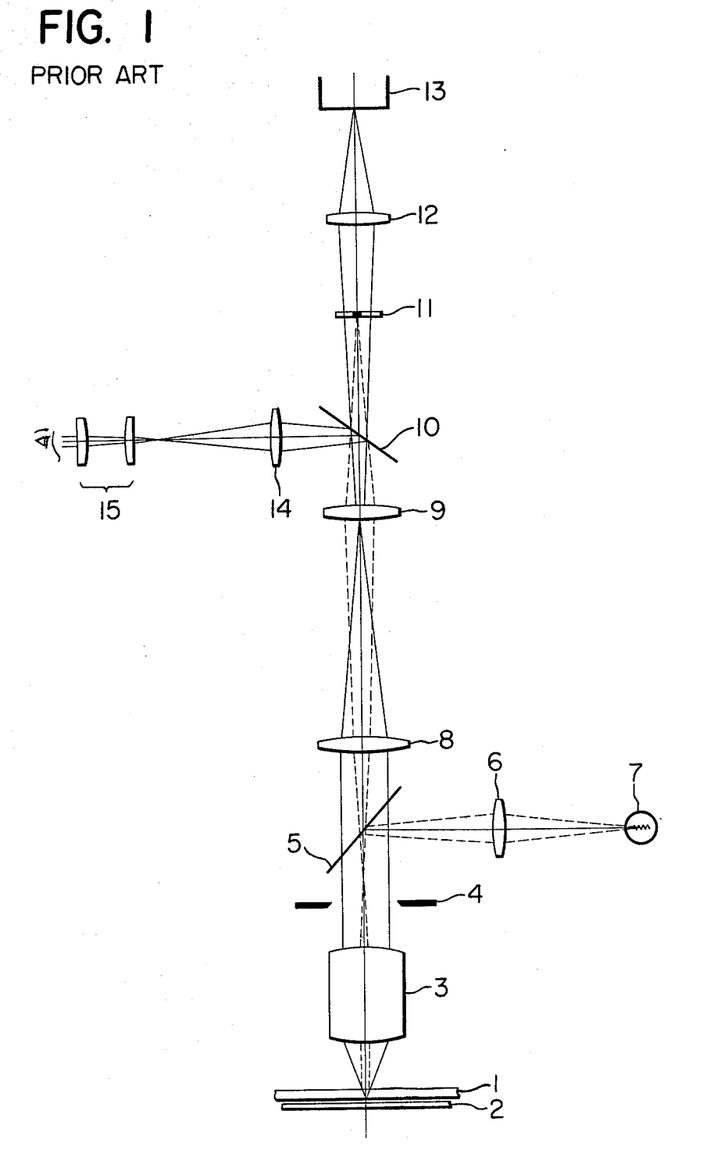
FIG. 1 is a schematic drawing of a conventional photo-electric detecting optical system.

In FIG. 1 there are shown a mask 1, a wafer 2, an objective lens 3, an aperture 4 thereof, a beam splitter 5 for guiding the light from a light source 7, a condenser lens 6, a relay lens 8, a field lens 9, a beam splitter 10 for guiding the light to a viewing system 14, a light shield or filter 11, a focusing lens 12, an image sensor 13 such as a reticon, a charge-coupled device, a bucket-brigade device or an image tube, an erector 14 for inverting the image for viewing, and an eyepiece lens 15.

Figure 2A:
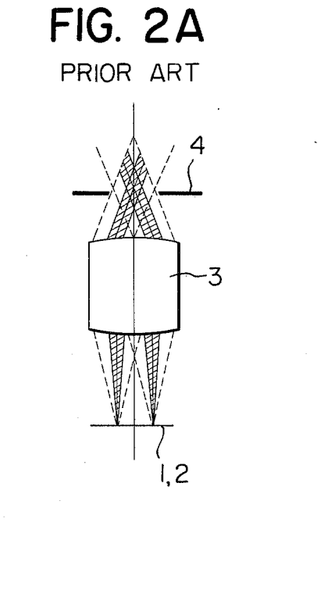
FIGS. 2A and 2B are drawings showing the function of a telecentric lens.
Figure 2B:
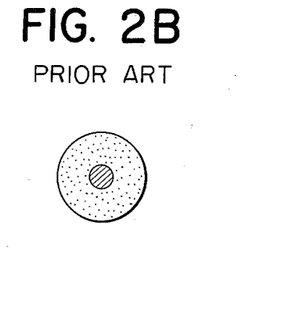

For the comprehension of the optical system shown in FIG. 1, it is necessary to understand the function of the objective lens 3. In FIGS. 2A and 2B there is shown an objective lens 3 of a telecentric arrangement wherein the front focal point coincides with the position of aperture 4 which determines the dimension of the light beam passing through said objective lens. The light passing through the center of said aperture 4, constituting the center line of said light beam, is called the principal ray. The center of said aperture 4 thus falling on the focal point of the objective lens 3, the chief ray becomes parallel to the optical axis of the objective lens passing therethrough and falls upon the object 1, 2 perpendicularly thereto. In a mirror reflecting portion of said object, said perpendicular incident ray proceeds, upon reflection, along the same light path and returns to the center of aperture 4, passing through the objective lens 3. On the other hand, in the presence of a pattern in the illuminated area, the light is subjected to a scattering in the boundary or edge portion of said pattern. Different from the mirror-reflected light, the light scattered by such edge portion does not return along the original light path, and does not, therefore, pass through the center of aperture 4 upon passing again through the objective lens 3. Stated differently, in observing the reflected light passing through the objective lens at the position of aperture, the mirror-reflected component and the scattered component are spatially separated within the aperture.

FIG. 2B shows the state of said separation, wherein the hatched area represents the light beam of the mirror-reflected component departing from said aperture and returning thereto upon passing through the objective lens, while the dotted area represents the scattered component which can be collected by the objective lens after scattering. For achieving an effective collection of the scattered component, the diameter of the light beam of the mirror-reflected component is usually selected satisfactorily smaller than the diameter of the aperture, with a diameter ratio generally within a range from 0.1 to 0.7.

The function of the optical system shown in FIG. 1 is easily understandable on the basis of the above-mentioned function of the aperture. In order to separate the scattered component from the non-scattered component in the aperture. The light source 7 is focused, through a lens 6 and a beam splitter 5, on the aperture 4 of the objective lens 3 into an image of a size satisfactorily smaller than the diameter of said aperture 4. As explained above, the diameter ratio is preferably selected within a range from 0.1 to 0.7. The method of forming an image of the light source on the aperture is already known as Kohler illumination and is also effective for preventing uneven illumination on the image plane. The illuminating light, upon passing through the objective lens 3, is reflected by the mask 1 or wafer 2 and reaches the aperture 4 upon re-passing through the objective lens 3, whereupon the non-scattered component returns to the original image of the light source formed in the aperture 4 while the scattered component is broadly distributed in the remaining area of the aperture, as already explained in relation to FIGS. 2A and 2B.

In FIG. 1, the light reflected by the mask and wafer is focused, by means of the relay lens 8, in the vicinity of the field lens 9. A viewing optical system is composed of an erector 14 for inverting the light separated by the beam splitter 10 to form an erect image and an eyepiece 15 for enlarging the image formed by said erector. Such viewing optical system is important for observing the wafer or for initial setting of the mask, but may be dispensed with under certain conditions which will be explained later. In the photo-electrical detecting system constituting the other optical path, there is provided a light shield or filter 11 in a conjugate plane of said aperture. Stated differently the aperture 4 and the filter 11 are in the conjugate relationship of an object and the image thereof with respect to the lenses 8 and 9. It will also be understood that the image magnification can be regulated by inserting a suitable lens between the beam splitter 10 and the filter 11.

Since the scattered and non-scattered components are mutually separated spatially at the aperture 4 as explained in the foregoing, said two components should also be mutually separated at the filter 11 where the image of the aperture 4 is formed, and said filter 11 performs a function of interrupting the non-scattered component and transmitting the scattered component alone, by intercepting the image of light source formed at said filter 11. Such filter 11 can be easily prepared by etching a pattern in a metal layer evaporated on a glass plate or by directing printing a pattern on a glass plate.

The light passing through the filter 11, solely consisting of the scattered component from the edge portion of the pattern, is focused, by means of the lens 12, onto the image sensor 13. The focusing being solely achieved by the scattered component, the image observed on the image sensor 13 consists of edge glitter, forming a sort of a dark-field pattern. Said image sensor can be conveniently composed of various image tubes, a charge-coupled device, a bucket-brigade device or a reticon.

The above-mentioned image sensor can also be utilized for a display of the image of object on a cathode ray tube. The image observed in this case is a dark-field image as explained above, but a light-field observation is also possible by replacing said filter 11 with a transparent glass plate. In such case viewing system 14, 15 may be dispensed with.

Figure 3A:
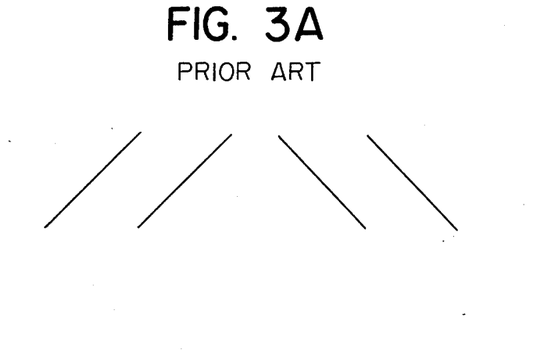
FIGS. 3A, 3B and 3C are drawings showing the conventional alignment marks.
Figure 3B:
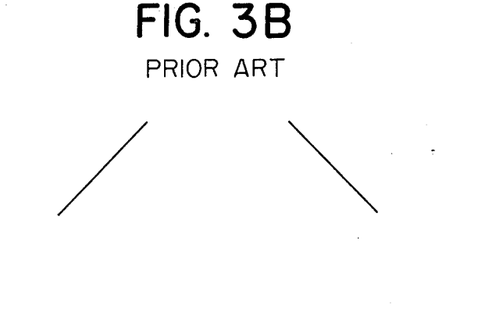
Figure 3C:
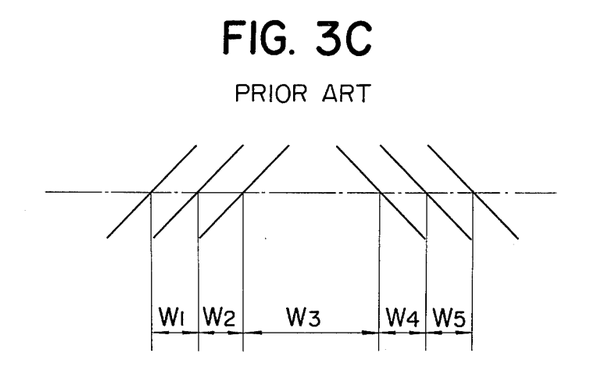

FIGS. 3A, 3B and 3C show the alignment marks provided on the mask and wafer shown in FIG. 1, wherein FIGS. 3A and 3B respectively show the alignment marks employed in the mask and the wafer, while FIG. 3C shows a state where said marks are mutually aligned. The line- or band-shaped area shown by chain line in FIG. 3C is focused on the one-dimensional image sensor. Representing the distances between the marking lines by w1-w5 as shown in the drawing, the amounts of misalignment $\Delta x$ and $\Delta y$ of the wafer with respect to the mask can be obtained from the following simple equations:

$$\Delta x = (w1 - w2) + (w4 - w5)/4$$

$$\Delta y = (w1 - w2) + (w4 - w5)/4$$

In the apparatus disclosed in the above-mentioned U.S. Pat. No. 4,062,623 there is inevitably an illuminating loss because of a two-dimensional spreading of the illuminated area on the mask and wafer because the image of light source formed on the aperture plane is in focus in two perpendicular directions.

This drawback is prevented by the present invention, of which a first embodiment will be explained in the following while making reference to FIGS. 4, 5A, 5B, 6A and 6B, wherein there are shown a laser 51 uses as the light source, a beam expander 52, a cylindrical lens 53 the generating line of which is parallel to the plane of the paper, a beam splitter for guiding the light to a viewing system composed of elements 71 etc., a field lens 55, a beam splitter 56 for guiding the light to a photo-electrical detecting system composed of elements 66 etc., a relay lens 57, a beam splitter 57 for guiding the light from the illuminating system for visual observation, an aperture 59 of an objective lens 60, a mask 61, and a wafer 62, which constitute an illuminating system for photo-electric signal detection achieving illumination of a line- or band-shaped area on the mask and wafer.

Figure 5A:
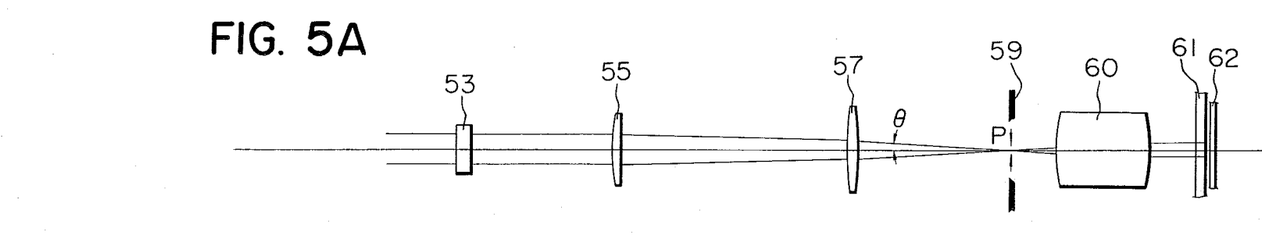
FIGS. 5A and 5B are drawings showing the function of a cylindrical lens.
Figure 5B:
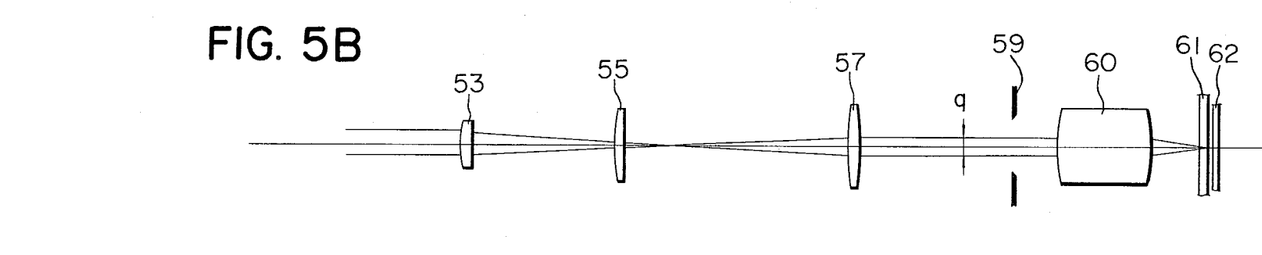

FIGS. 5A and 5B illustrate the function of the cylindrical lens 53 constituting a principal feature of the present invention, said cylindrical lens receiving a parallel light beam from the beam expander 52. The function of such cylindrical lens should be separately considered in a cross section functioning as a plate of parallel surfaces without any curvature and in an another cross section perpendicular thereto with highest curvature, said cross sections being respectively shown in FIGS. 5A and 5B.

It is to be noted that FIGS. 5A and 5B only show the portions necessary for explaining the function of the cylindrical lens. In a cross section shown in FIG. 5A, the cylindrical lens functions, in combination with the field lens 55 and relay lens 57, to focus the laser light on the aperture 59 of the objective lens 60. Assuming the maximum angle of the incident ray from the relay lens to the aperture with respect to the optical axis as $\theta$, the focal length of lens as $f$, and the longitudinal length of linear area photo-electrical detection as $2a$, the required condition is:

$$\theta \geq \arctan a/f$$

On the other hand the width P of a light beam focused on the aperture with a maximum angle $\theta$ is given by:

$$P \simeq \lambda\theta$$

Assuming that $a=1$ mm, $f=30$ mm and $\lambda=0.63$ μm, one can obtain:

$$P \simeq 19 \text{ μm}$$

indicating that the spreading of the focusing light beam at the aperture plane as shown in FIG. 5A is extremely small. Thus focused light becomes a parallel light beam in this cross section by means of the function of the lens 60.

On the other hand FIG. 5B shows the function of the cylindrical lens 53 in a cross section perpendicular to that represented in FIG. 5A. In this cross section the cylindrical lens functions to focus the light from the light source 51 in the vicinity of the field lens 55, and to provide, in combination with the lenses 55 and 57, a parallel light beam from the relay lens 57 to the objective lens 60, said parallel light beam being focused at the focal point of said objective lens 60, namely on the mask 61 or wafer 62. Thus, between the width of parallel light beam q, the focal length f of lens and the diameter d of the light beam on the focal plane there is obtained a relation:

$$d \simeq 2f\lambda/q$$

Assuming that $d=20$ μm, $f=30$ mm and $\lambda=0.63$ μm, one can obtain:

$$q = 1.9 \text{ mm.}$$

The above-mentioned result indicates that, in case of illuminating an oblong area of 2 mm×20 μm with a light of $\lambda=0.63$ μm and with an objective lens of a focal length $f=30$ mm, the spreading of light of the aperture plane is also an oblong area p×q or 19 μm×1.9 mm. In case of a lens with an N.A. of 0.25, the aperture diameter is 15 mm, of which an area of 19 μm×1.9 mm or 0.019×1.9 mm² is effectively utilized for the illumination of an oblong area. Thus it is rendered possible, by the present embodiment, to irradiate the surface of an object with an oblong sheet-shaped light beam, of which the principal ray is parallel to the optical axis of the objective lens 60.

Figure 4:
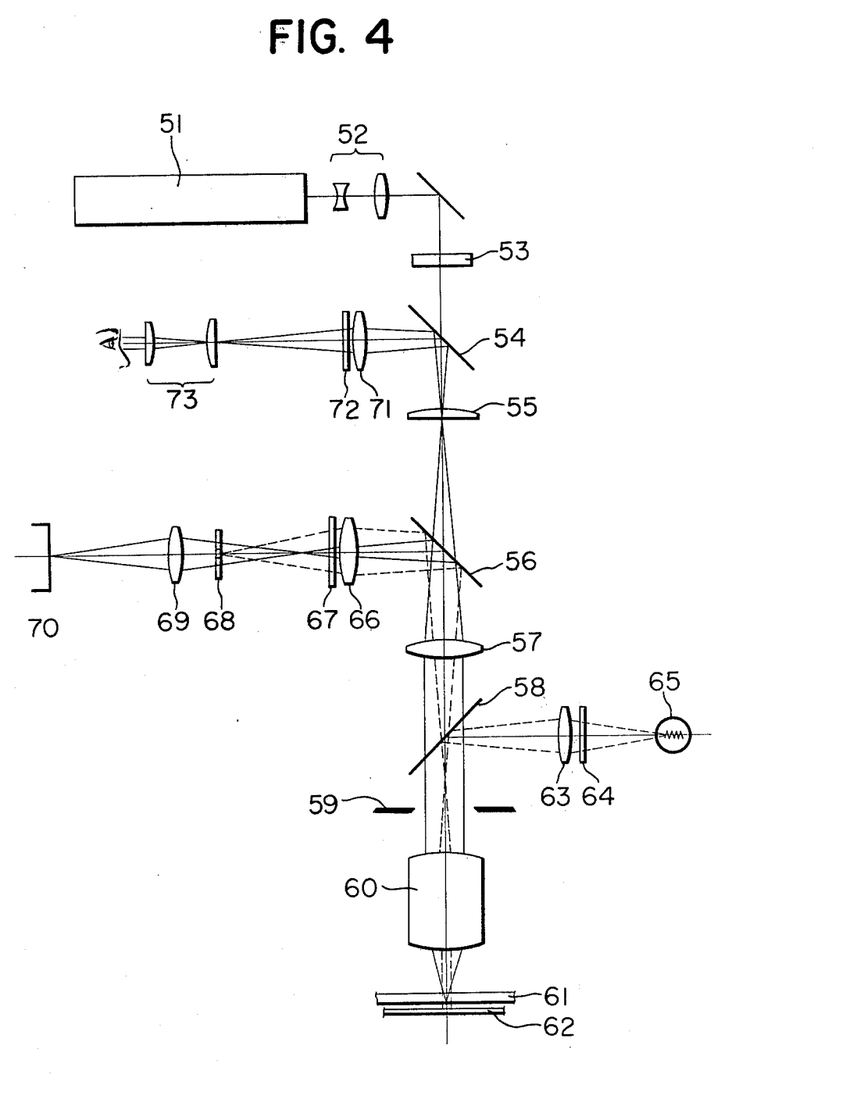
FIG. 4 is a drawing showing a first embodiment of the present invention employing a combination of an illuminating system utilizing a cylindrical lens and an image sensor.

The fact that the incident illuminating light beam has an extremely small effective diameter on the aperture is convenient for a detecting system utilizing a filter for selectively transmitting the edge-scattered light. Based upon the principle shown in FIG. 2, the mirror-reflected unscattered component of the illuminating light beam returns to the original point while the scattered component is broadly distributed in the aperture. The reflected light is guided, by means of the beam splitter 56, to a photo-electrical detecting system comprising an aperture focusing lens 66, a filter 67 for transmitting the light of a wavelength range necessary for photo-electrical detection and a light-shield or filter 68.

Figure 6A:
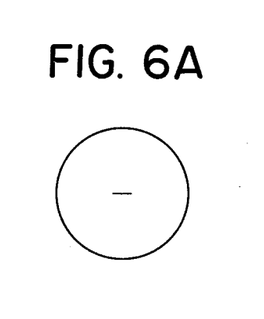
FIGS. 6A and 6B are drawings showing the shape of a light shield.

Said filter 68 is placed, in a similar manner as in FIG. 1, in a position conjugate with respect to the aperture 59 of the objective lens to intercept the unscattered component of the reflected light. Said intercepted portion can be very small since, in the foregoing example, the effective diameter of unscattered light on the aperture plane is 0.019×1.9 mm² while the aperture diameter is 15 mm. This fact indicates an improved efficiency for scattered component collection, giving rise to a significant advantage in the photo-electrical detection. FIG. 6A shows an example of such filter wherein the light-intercepting portion is represented by a short bar while the remaining surface functions as transmitting plane.

Also in case of utilizing patterns shown in FIG. 3, it is also possible to improve the S/N ratio of the detection signal due to a fact the scattered light from the pattern is spread solely in the direction of ±45°.

Figure 6B:
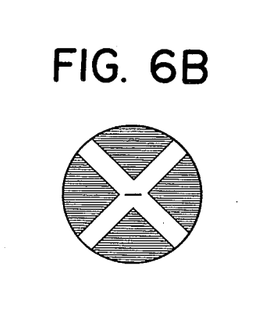

FIG. 6B shows an another filter structure showing no loss for the light scattered in the direction of ±45°, in consideration of the above fact.

The light subjected to optical filtering by such filter 68 is focused by the lens 60 onto the image sensor 70, which is thus in conjugate relationship with the mask 61 and wafer 62. It is to be noted that the image sensor 70 detects the edge portion of the pattern on the mask and wafer. Said image sensor 70 is arranged in a position corresponding to the image of an oblong area illuminated by the light from the light source 51. Since said illuminated area is one-dimensional, said image sensor can be composed of a one-dimensional sensor such as a reticon. For this purpose it is also naturally possible to employ a solid image sensor such as a charge-coupled device or an imaging tube.

In FIG. 4 the components 63–65 constitute an illuminating system for viewing while the components 71–73 constitute a viewing system, the functions of which are identical to those in FIG. 1 and are therefore omitted. In the drawing there are further shown a filter 64 for cutting the sensitive wavelength range of a photoresist, and a filter 72 for cutting the laser light from the light source 51.

The above-explained optical system is capable of effectively guiding the scattered light from the pattern edge to the image sensor 70. The image scanning is conducted electrically, and thus in static manner. The exclusive collection of scattered light make it possible to obtain a high contrast in the detection signal and to to remove reflection from the rear surface of mask thereby achieving a high S/N ratio.

According to the present invention it is further possible to incorporate the alignment marks within the scribe lines since the photo-electric signal is obtained from an extremely small band-shaped area.

Figure 7:
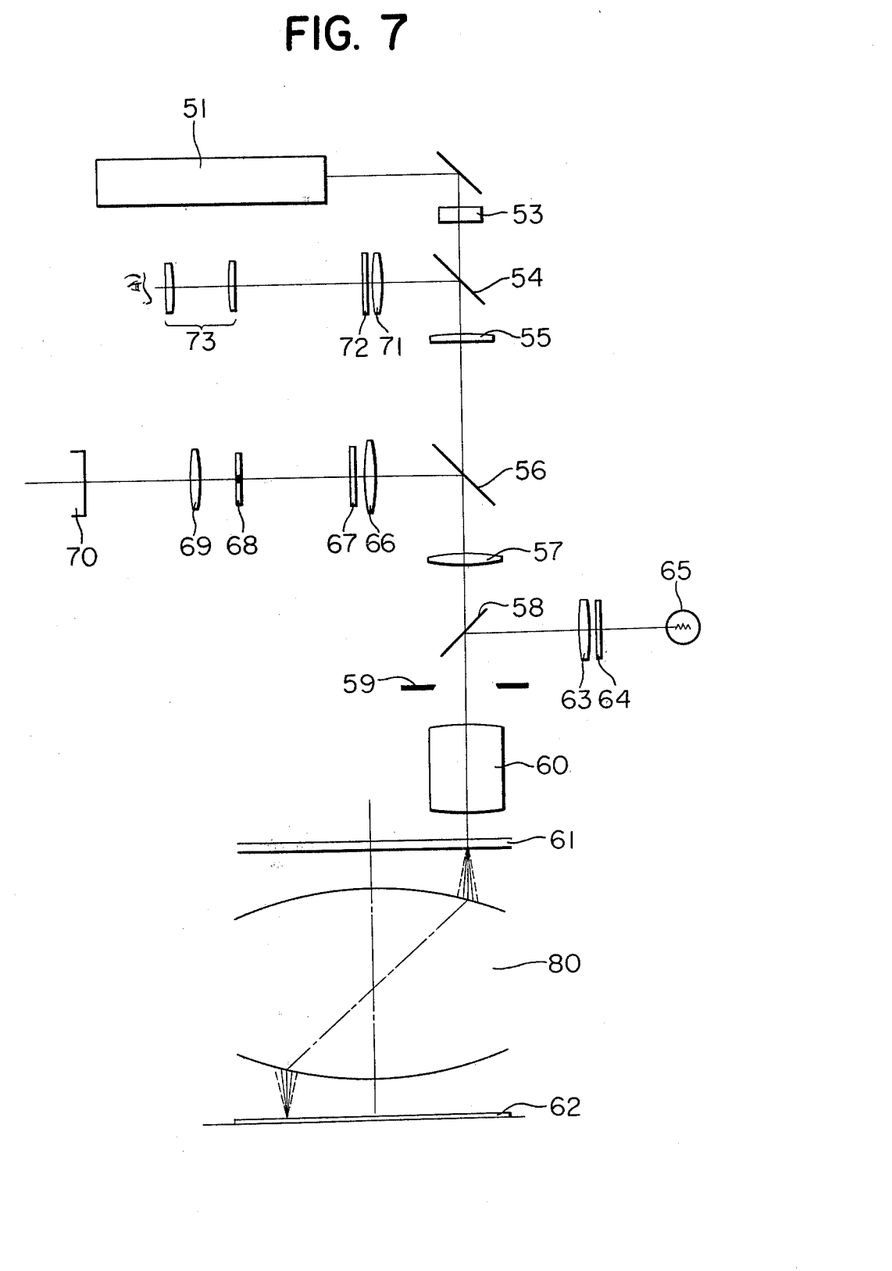
FIG. 7 is a drawing of a second embodiment wherein the present invention is applied to a projection method.

The embodiment shown in FIG. 4 shows the application of the present invention to the contact method or proximity method, among various methods for transferring a mask pattern onto a wafer in the integrated circuit production. Naturally the present invention is also applicable to the projection method utilizing lenses and mirrors as exemplified in an embodiment shown in FIG. 7, wherein the functions of the optical system present above the mask is identical to those in the embodiment shown in FIG. 4. In comparison with FIGS. 6A and 6B the lens 52 disposed directly after the laser 51 is omitted in this case as it only functions for laser beam expansion or power adjustment. The embodiment of FIG. 7 is different from the foregoing embodiments in that a focusing means 80 is provided between the mask and wafer. Said focusing means is provided with a telecentric structure wherein the principal ray is perpendicular to the mask and wafer. The function of system and the collection of scattered component are conducted in an identical manner as in the embodiment of FIG. 4.

Figure 8:
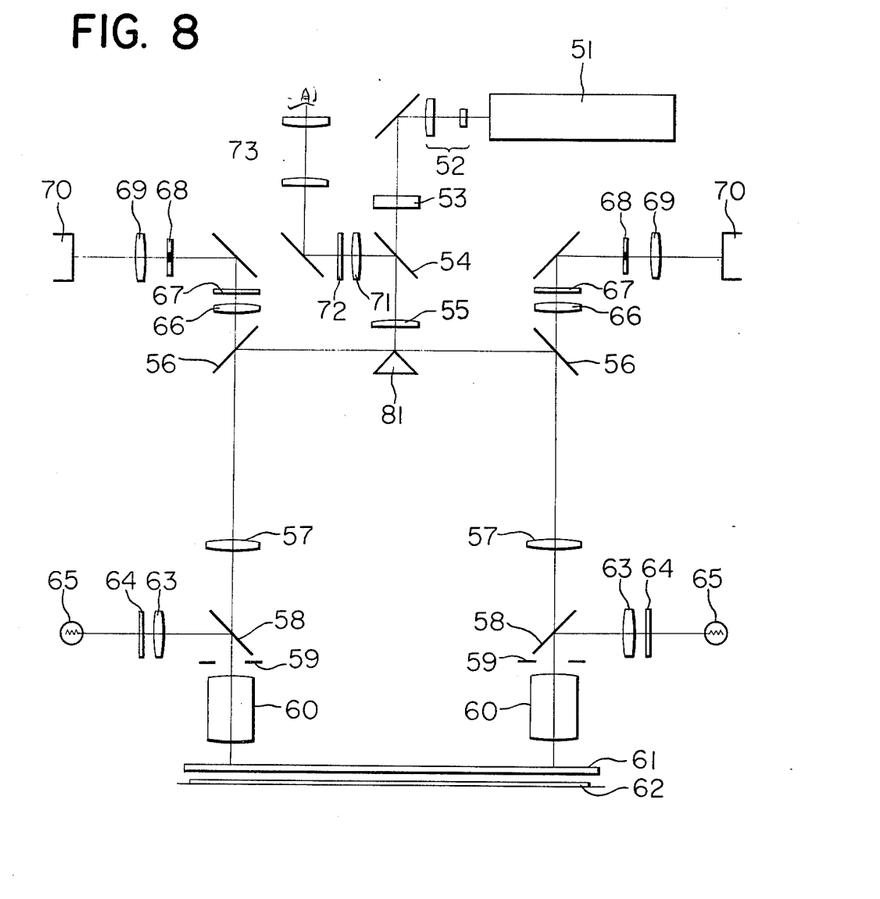
FIG. 8 is a drawing of an another embodiment wherein the system of the present invention is divided into two channels.

In the actual aligning apparatus for mask and wafer, two-dimensional alignment is achieved by determining the translational components x, y and the rotational component θ through the observation of two points on the wafer and mask. For this purpose there may be provided two systems shown in FIG. 4, but the inlet portion from the laser can be utilized as common for both systems by a modification of optics. FIG. 8 shows an embodiment wherein a laser illuminating system incorporating two microscope objective systems is commonly utilized for both systems, wherein the components of like members have the like functions as in FIG. 4 or 7.

In FIG. 8 there is provided a mirror 81 for synethesizing the images from the left and right objective lenses, the mirror ridge corresponding to the primary image plane of the mask and wafer through the microscope objective lens 60 and relay lens 57. The dividing line in the viewing field corresponds to said ridge of mirror 81.

Figure 9:
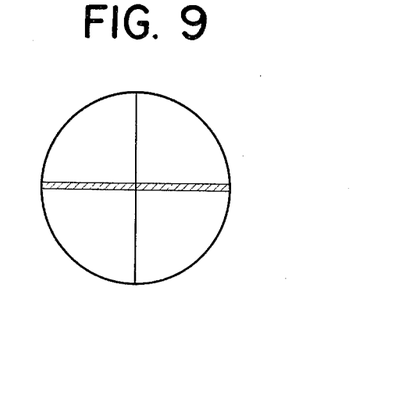
FIG. 9 is a drawing of the image observed through the system shown in FIG. 8.

In this case, if the uncurved cross section of the cylindrical lens 53 is parallel to the paper plane, the laser light is spread at the mirror 81 in a direction perpendicular to said dividing line of the viewing field, as shown in FIG. 9, wherein the photo-electrical detection area or illuminated area, represented by hatching, extends perpendicular to said dividing line. In this manner the optical system of FIG. 8 allows a laser light source to effectively transmit the light to two objective lenses.

Although the foregoing embodiments are limited to the signal detection from a line- or band-shaped area, it is also possible, as a modification, to detect signal from a cross-shaped area or, as a variation thereof, from a T-shaped area. In case the alignment marks are incorporated within the scribe lines of mask and wafer, said cross-shaped area corresponds to a corner portion of a chip.

Figure 10:
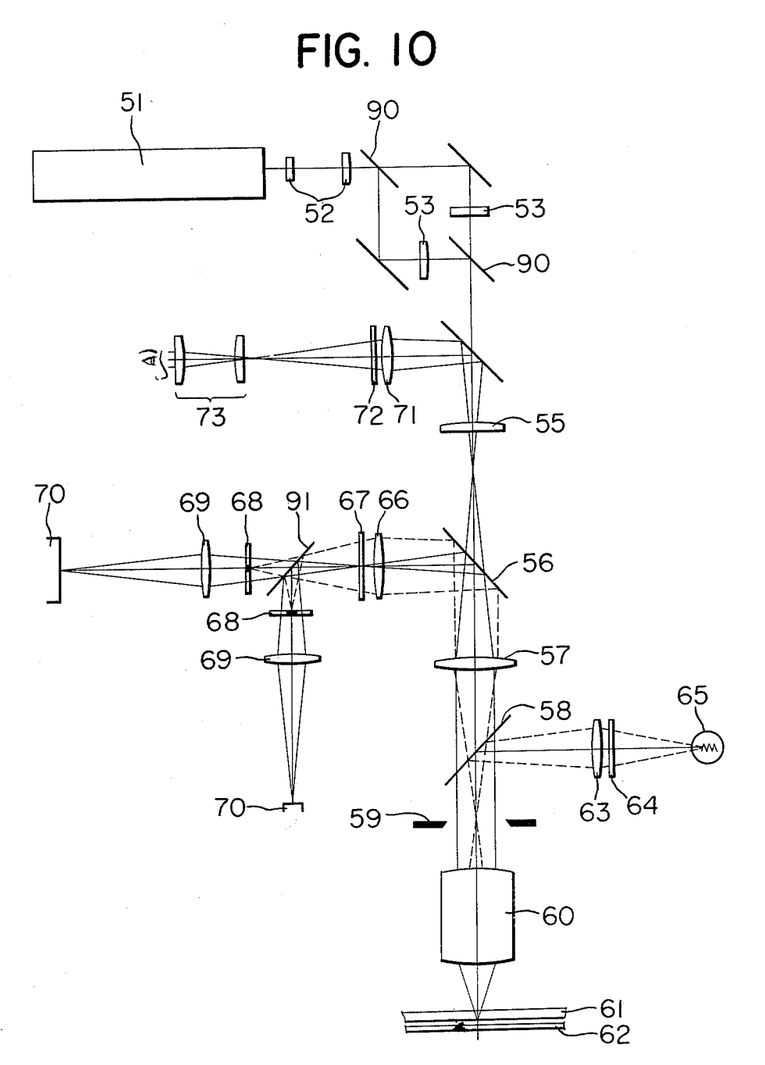
FIG. 10 is a drawing of an optical system adapted to obtain signal from a cross-shaped area.

FIG. 10 shows an optical system for detecting a cross-shaped area, the composition of which is derived from a fact that such cross-shaped area can be produced by superposing of two optical systems shown in FIG. 4 with a mutual angle of 90° therebetween. The cylindrical lenses 53 are arranged so as to be mutually perpendicular in two light paths divided by the beam splitter 90. The light beam passing through the cylindrical lenses 53 is provided with a conjugate relationship identical with that in FIGS. 5A and 5B. The photo-electrical detection system is divided into two channels by means of a beam splitter 91 since the image sensor 70, if one-dimensional, has to be placed in crossing relationship on the conjugate plane. The use of said beam splitter 91 and the division of channel can be dispensed with if the image sensor 70 is two-dimensional, such as a charge-coupled device or a bucket-brigade device.

Polarized light can be effectively used for avoiding the loss by the beam splitter. For example in the composition of FIG. 10 the loss of light can be minimized by employing polarized beam splitters for the components 90 and 91.

Figure 11A:
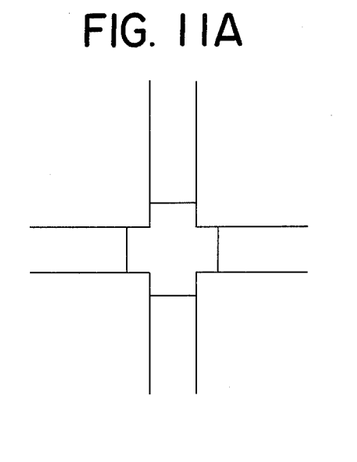
FIGS. 11A, 11B and 11C are drawings showing the alignment marks adapted for the system shown in FIG. 10.
Figure 11B:
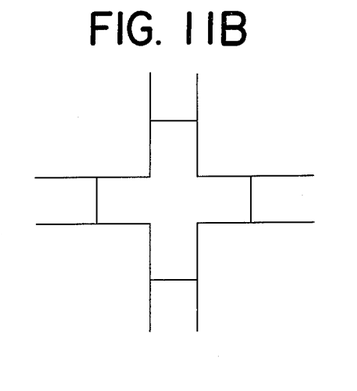
Figure 11C:
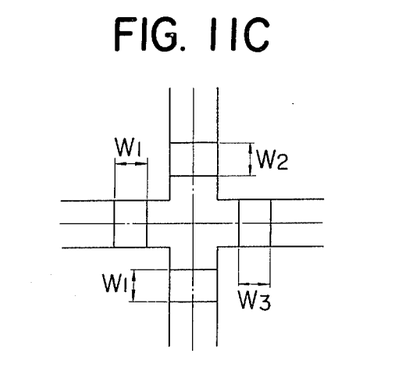

FIG. 11 shows an example of alignment marks suitable for detection from a cross-shaped area, wherein FIGS. 11A and 11B are respectively patterns for mask and wafer or vice versa, while FIG. 11C shows the state of correct alignment where one can obtain:

$$w1 = w3; w2 = w4.$$

The chain lines represent the center lines of photo-electric detection by the image sensor 70.

Further, the present invention is not limited to the alignment apparatus for an integrated circuit printer but is also applicable to other apparatus for signal detection with a high contrast such as a bar code reader, a curve tracer or a pattern inspecting machine.

What we claim is:

1. A photo-optical detecting apparatus for photo-electrically detecting an object having a flat reflection surface and an inclined surface with a certain inclination with respect to said flat reflection surface, comprising:
    a. a telecentric system including a telecentric lens, the optical axis of which is perpendicular to the flat reflection surface of said object and a clear aperture of a predetermined size located on the focal plane of said telecentric lens;
    b. an illuminating optical system for forming a line image of a light source on said focal plane smaller in size than said clear aperture;
    c. an image focusing means arranged coaxially with the optical axis of the telecentric lens for imaging said focal plane and said object;
    d. a one-dimensional image sensor for photo-electrically detecting the image of said object, said sensor being arranged on the image plane of said object; and
    e. an optical filter means disposed at the position of the image of said focal plane for intercepting light from the flat reflection surface of said object, and for directing the light from the inclined reflection surface to said sensor.

2. An apparatus according to the claim 1 wherin said illuminating optical system is provided with a cylindrical lens.

3. Apparatus for photoelectrically detecting a signal from a substantially linear area of an object, comprising:
    a. a first optical system for projecting a substantially linear light flux onto said linear area on the object and forming a linear light flux on a focal plane of an objective lens adapted to observe the object;
    b. a second optical system for forming an image of the object on an imaging plane;
    c. an image sensor disposed on the imaging plane; and
    d. optical filter means, disposed between the object and said image sensor, for blocking non-scattered light from the object and passing scattered light from the object.

4. Apparatus according to claim 3, wherein said first optical system includes a cylindrical lens.

5. Apparatus according to claim 4, wherein the light flux, passing through said cylindrical lens and then entering said objective lens, is afocal as viewed in a certain cross-section thereof and focussed on the focal plane of said objective lens as viewed in a cross-section thereof perpendicular to said first mentioned cross section.

6. Apparatus according to claim 3, wherein the object includes a wafer and a mark therefor.

7. Apparatus according to claim 6, wherein said linear area is contained in a scribe line.

8. Apparatus according to claim 6, wherein said optical filter means has a non-passing portion which is sufficient to block the non-scattered light, and has a selective passing property in the direction of expansion of the scattered light from alignment marks of the wafer and the mark.

UNITED STATES PATENT AND TRADEMARK OFFICE
CERTIFICATE OF CORRECTION

PATENT NO. : 4,262,208
DATED : April 14, 1981
INVENTOR(S) : AKIYOSHI SUZKI, ET AL.

It is certified that error appears in the above—identified patent and that said Letters Patent is hereby corrected as shown below:

Column 1, line 17 change "5,062,623" to --4,062,623--.

Column 2, line 44, after "principal" insert --chief--;
Column 2, line 47, after "lens" insert --upon--.

Column 3, line 20, put 2 dots over the "o" in Köhler.

Column 4, line 6, after "case" insert --the--; line 23, after "=", change "(w1-w2)" to -- -(w1-w2)--.

Column 5, line 6, change "$\lambda\theta$" to --$\lambda/\theta$--; line 41, change "of" to --on--.

Column 6, line 13, delete "an"; line 15, change "direction" to --directions--; line 41, change "make" to --makes--.

Column 7, line 19, before "relay" insert --the--.

Signed and Sealed this

Third Day of November 1981

[SEAL]

Attest:

GERALD J. MOSSINGHOFF

Attesting Officer    Commissioner of Patents and Trademarks